(12) United States Patent
Naeki et al.

(10) Patent No.: US 12,494,390 B2
(45) Date of Patent: Dec. 9, 2025

(54) SUBSTRATE PROCESSING APPARATUS, SUBSTRATE PROCESSING METHOD AND STORAGE MEDIUM

(71) Applicant: Tokyo Electron Limited, Tokyo (JP)

(72) Inventors: Toshiki Naeki, Koshi (JP); Kentaro Yamamura, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 519 days.

(21) Appl. No.: 17/661,315

(22) Filed: Apr. 29, 2022

(65) Prior Publication Data

US 2022/0359243 A1 Nov. 10, 2022

(30) Foreign Application Priority Data

May 7, 2021 (JP) ................................ 2021-079181

(51) Int. Cl.
*B05C 11/10* (2006.01)
*H01L 21/027* (2006.01)
*H01L 21/67* (2006.01)

(52) U.S. Cl.
CPC .... *H01L 21/67253* (2013.01); *B05C 11/1005* (2013.01); *H01L 21/0276* (2013.01); *H01L 21/6715* (2013.01)

(58) Field of Classification Search
USPC ..... 118/52, 612, 58, 666, 667, 696–698, 66, 118/712, 665
See application file for complete search history.

(56) References Cited

U.S. PATENT DOCUMENTS 6,004,047 A * 12/1999 Akimoto ................. G03F 7/162
118/52
2016/0293460 A1* 10/2016 Ohashi .............. H01L 21/67248

FOREIGN PATENT DOCUMENTS

| JP | H07-161619 A | | 6/1995 | |
| JP | H08-022944 A | | 1/1996 | |
| JP | 2003236799 A | * | 8/2003 | |
| JP | 2011082577 A | * | 4/2011 | ......... H01L 21/0337 |
| JP | 2019-062003 A | | 4/2019 | |
| KR | 20190045521 A | * | 5/2019 | |
| TW | 383456 B | * | 1/2013 | |

OTHER PUBLICATIONS

English Translation JP2011082577 (Year: 2011).*
English Translation TW I383456B (Year: 2013).*
English Translation KR-20190045521-A (Year: 2019).*
English Translation JP-2003236799-A (Year: 2003).*

* cited by examiner

*Primary Examiner* — Yewebdar T Tadesse
(74) *Attorney, Agent, or Firm* — Armstrong Teasdale LLP (57) ABSTRACT

A substrate processing apparatus for processing a substrate to be measured by a film thickness measurement device, includes: a heat treatment part configured to heat-treat a substrate coated with a coating film; and a fluid supply part configured to supply a fluid, which suppresses variations in a film thickness over time until the film thickness is measured by the film thickness measurement device, to the substrate during or after the heat-treatment by the heat treatment part.

10 Claims, 7 Drawing Sheets

SUBSTRATE PROCESSING APPARATUS, SUBSTRATE PROCESSING METHOD AND STORAGE MEDIUM

CROSS-REFERENCE TO RELATED APPLICATION

This application is based upon and claims the benefit of priority from Japanese Patent Application No. 2021-079181, filed on May 7, 2021, the entire contents of which are incorporated herein by reference.

TECHNICAL FIELD

The present disclosure relates to a substrate processing apparatus, a substrate processing method, and a non-transitory computer-readable storage medium.

BACKGROUND

In the related art, there is known a film thickness measurement device that includes a film thickness measurement part configured to measure the film thickness of a film formed on a surface of a substrate, a humidity measurement part configured to measure the humidity around the film thickness measurement part, a storage part configured to store information on the correlation between the humidity and the film thickness, a correction part configured to calculate a first correction amount for correcting a film thickness measurement value from the humidity measured by the humidity measurement part and the information stored in the storage part and correct the film thickness measurement value measured by the film thickness measurement part using the calculated first correction amount, and a controller configured to control the film thickness measurement part, the humidity measurement part and the correction part.

PRIOR ART DOCUMENT

Patent Document

Patent Document 1: Japanese Laid-Open Patent Publication No. 2019-062003

SUMMARY

According to one embodiment of the present disclosure, there is provided a substrate processing apparatus for processing a substrate to be measured by a film thickness measurement device, the apparatus including: a heat treatment part configured to heat-treat a substrate coated with a coating film; and a fluid supply part configured to supply a fluid, which suppresses variations in a film thickness over time until the film thickness is measured by the film thickness measurement device, to the substrate during or after the heat-treatment by the heat treatment part.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a manufacturing process of a semiconductor device or the like, a series of photolithography steps including a resist coating process in which a resist liquid is supplied onto a semiconductor wafer (hereinafter sometimes referred to as a "wafer") as a substrate to form a resist film is performed, whereby a predetermined resist pattern is formed on the wafer. Before forming the resist film, an antireflection film is generally formed in advance.

When forming the antireflection film, a coating liquid as a material of the antireflection film is applied to the entire surface of the wafer by a so-called spin coating method, and then a heat treatment called a baking process is performed to remove a solvent in the antireflection film, thereby curing the antireflection film. Next, a resist film is formed on the antireflection film. A film thickness of the antireflection film is measured before the resist film is formed.

However, even after the baking process, the film thickness may be changed over time until the film thickness measurement or during the film thickness measurement. As a result, the measurement result may vary. Thus, the film thickness may be erroneously determined when performing a correction based on the film thickness in the subsequent processing.

Regarding this point, in the technique disclosed in the related art, the film thickness is corrected based on the humidity of the surroundings. However, the over-time change of the film thickness from the baking process to the subsequent measurement of the film thickness is not taken into account. Therefore, there is still a possibility that the measurement value may vary. This tendency is particularly remarkable in a SiARC film (silicon-containing antireflection film) having a small film thickness. This significantly affects an etching process performed after the resist film is formed.

As a result, daily differences due to differences in inspection timing and deterioration in film thickness stability may occur. However, the timing of measurement and the time management until the subsequent process are complicated and difficult. Therefore, there is a demand for a technique for suppressing film thickness variations due to the over-time change.

Therefore, in the technique according to the present disclosure, as for the substrate to be measured by a film thickness measurement device, the variations in film thickness measurement result for the substrate is suppressed in consideration of the over-time change in the film thickness from the baking process to the subsequent measurement of the film thickness.

Hereinafter, a configuration of a substrate processing apparatus according to the present embodiment will be described with reference to the drawings. In the subject specification, elements having substantially the same functional configuration will be designated by like reference numerals, and the duplicate description thereof will be omitted.

Figure 1:
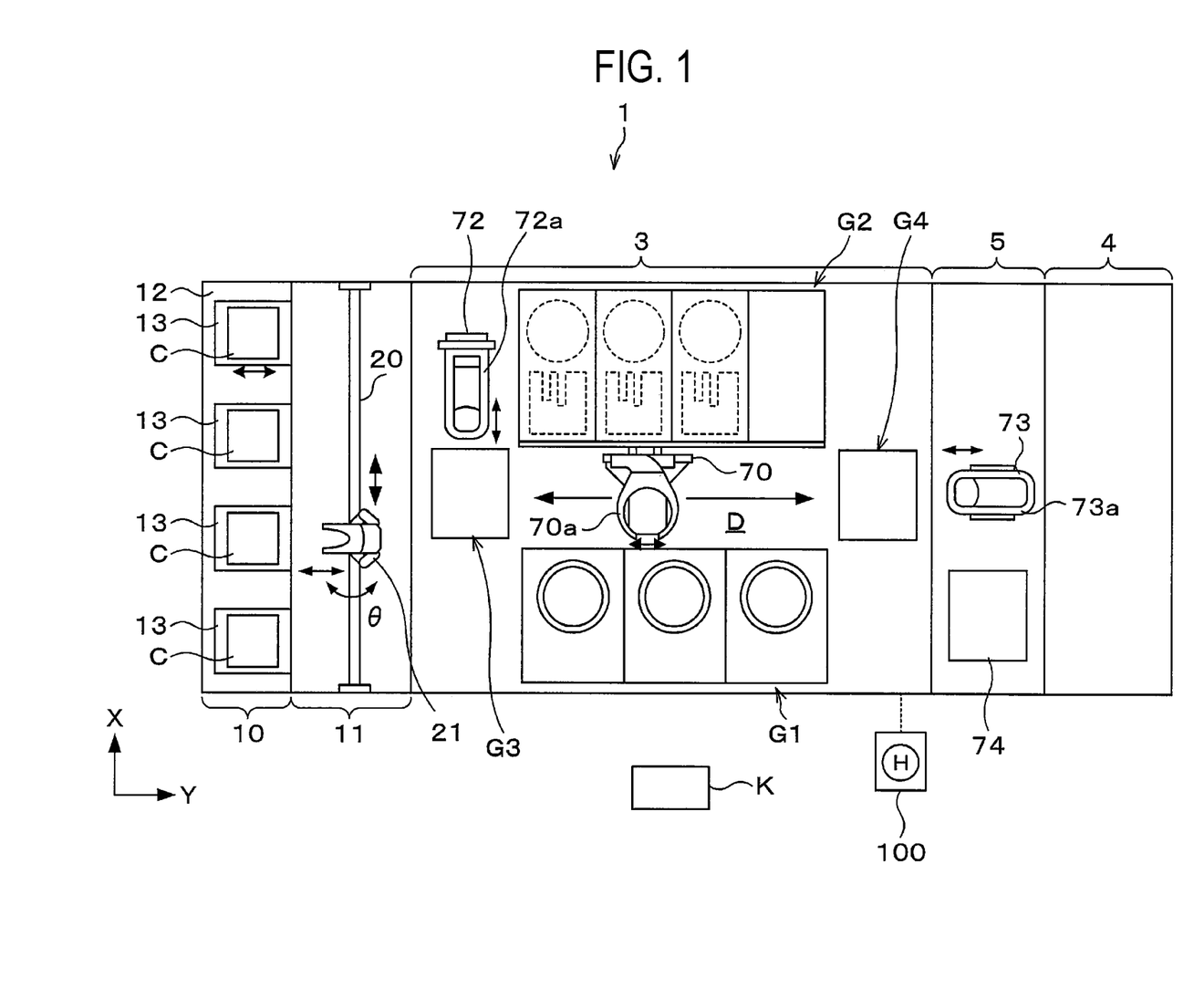
FIG. 1 is a plan view schematically showing an outline of a configuration of a substrate processing system according to an embodiment.
Figure 2:
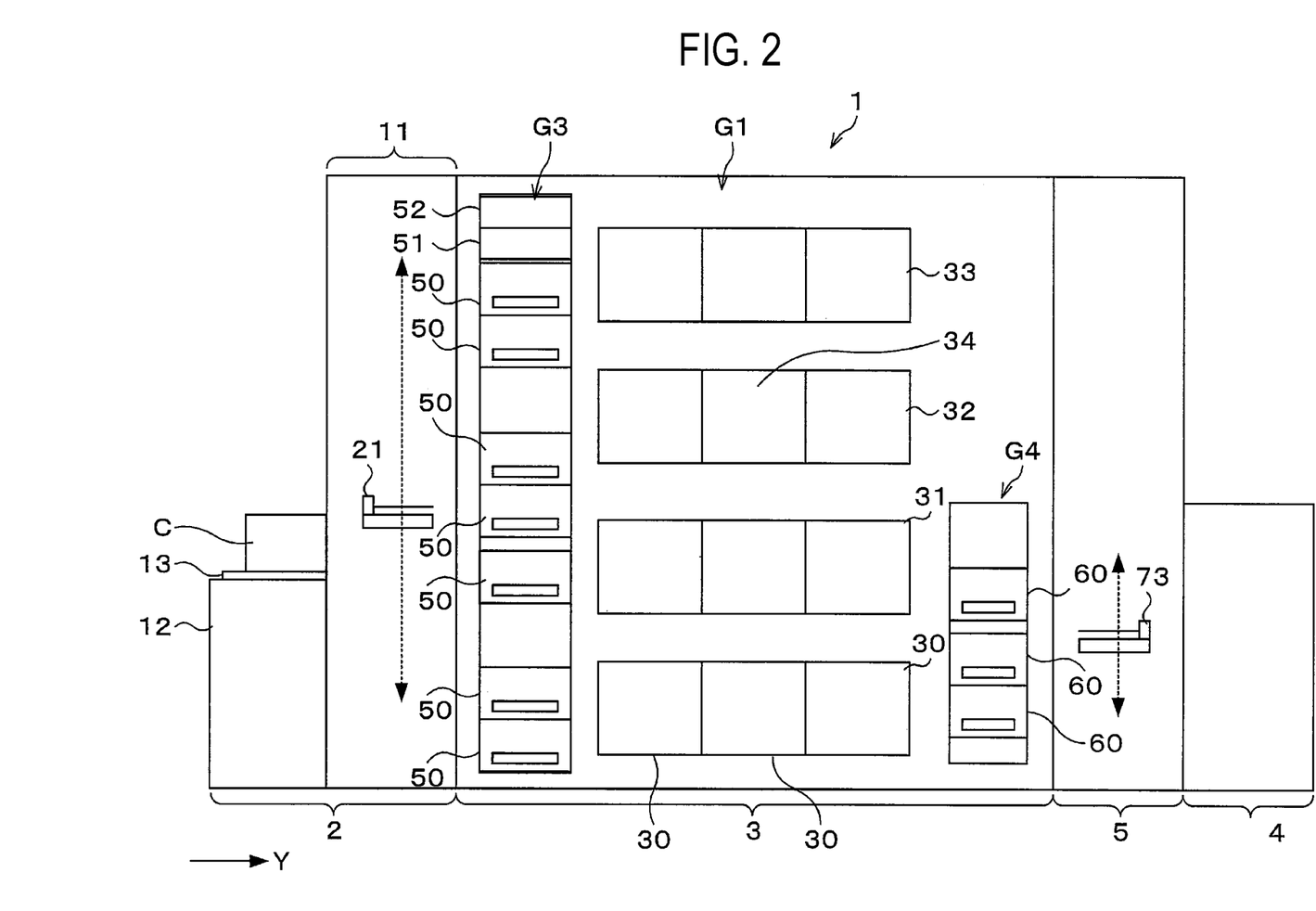
FIG. 2 is an explanatory diagram schematically showing an outline of a configuration on the front side of the substrate processing system according to the embodiment shown in FIG. 1.
Figure 3:
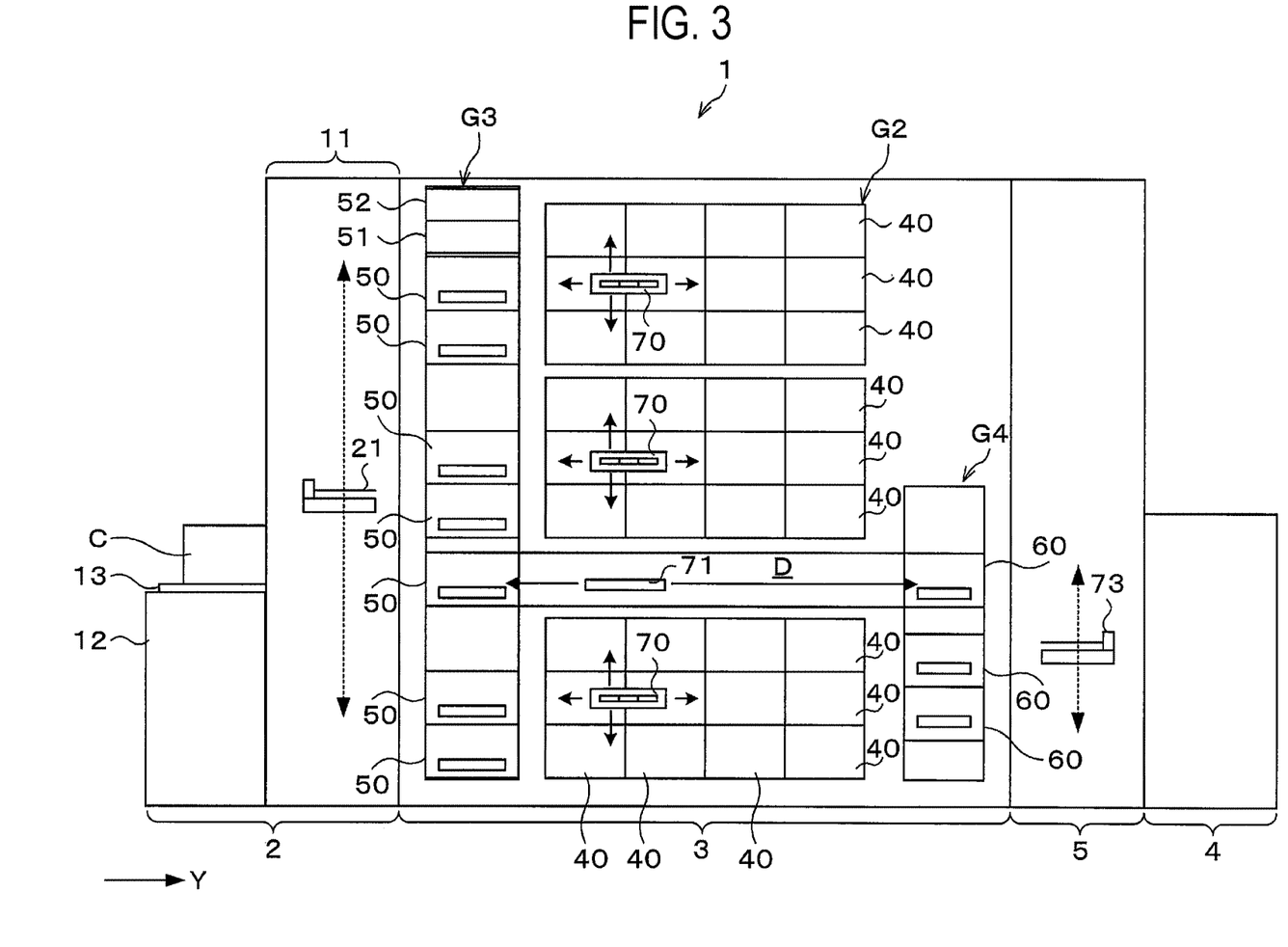
FIG. 3 is an explanatory diagram schematically showing an outline of a configuration on the back side of the substrate processing system according to the embodiment shown in FIG. 1.

FIG. 1 is an explanatory diagram showing an outline of an internal configuration of a substrate processing system 1 as a substrate processing apparatus according to the present embodiment. FIGS. 2 and 3 are a front view and a rear view showing the outline of the internal configuration of the substrate processing system 1, respectively. The substrate processing system 1 is configured as a system for forming a lower layer film, an intermediate layer film and a resist film on a wafer W and developing a resist film which has been subjected to an exposure process.

As shown in FIG. 1, the substrate processing system 1 includes a cassette station 2 for loading and unloading a cassette accommodating a plurality of wafers W, and a processing station 3 provided with a plurality of processing apparatuses for performing unit processes constituting coating/developing processes. The substrate processing system 1 has a configuration in which the cassette station 2, the processing station 3, and an interface station 5 that transfers the wafer W to and from an exposure apparatus 4 adjacent to the processing station 3 are integrally connected to each other.

The cassette station 2 is divided into, for example, a cassette loading/unloading part 10 and a wafer transfer part 11. For example, the cassette loading/unloading part 10 is provided at the end of the substrate processing system 1 on the negative side in the Y direction (on the left side in FIG. 1). The cassette loading/unloading part 10 is provided with a cassette stage 12. A plurality of, for example, four placement plates 13 are provided on the cassette stage 12. The placement plates 13 are provided side by side in a line in the horizontal X direction (vertical direction in FIG. 1). A cassette C may be placed on each of the placement plates 13 when the cassette C is loaded and unloaded into and from the substrate processing system 1.

As shown in FIG. 1, the wafer transfer part 11 is provided with a wafer transfer device 21 that can move on a transfer path 20 extending in the X direction. The wafer transfer device 21 is movable in the vertical direction and around the vertical axis (θ direction) and can transfer the wafer W between the cassette C on each placement plate 13 and a delivery device of a third block G3 of the processing station 3, which will be described later.

The processing station 3 is provided with a plurality of, for example, first to fourth blocks G1, G2, G3 and G4 equipped with various apparatuses. For example, the first block G1 is provided on the front side of the processing station 3 (negative side in the X direction in FIG. 1), and the second block G1 is provided on the back side of the processing station 3 (positive side in the X direction in FIG. 1). Further, the third block G3 is provided on the cassette station 2 side of the processing station 3 (negative side in the Y direction in FIG. 1), and the fourth block G4 is provided on the interface station 5 side of the processing station 3 (positive side in the Y direction in FIG. 1).

The first block G1 is provided with a liquid processing apparatus as a processing apparatus. For example, as shown in FIG. 2, a developing apparatus 30, a lower layer film forming apparatus 31, an intermediate layer film forming apparatus 32, and a resist film forming apparatus 33 are arranged in the named order from below. The developing apparatus 30 performs a developing process in which, after exposure, a developing liquid is supplied to the wafer W, on which the resist film is formed, to develop the wafer W. The lower layer film forming apparatus 31 performs a lower layer film forming process in which a coating liquid for forming a lower layer film is supplied to the wafer W to form a lower layer film on the wafer W. The lower layer film is, for example, a SoC (Spin-On-Carbon) film. The intermediate layer film forming apparatus 32 performs an intermediate layer film forming process in which a coating liquid for forming an intermediate layer film is supplied to the wafer W to form a lower layer film on the wafer W. The intermediate layer film is, for example, a silicon-containing antireflection film (SiARC film). The resist film forming apparatus 33 performs a resist film forming process in which a resist liquid is supplied to the wafer W to form a resist film on the wafer W.

For example, three developing apparatuses 30, three lower layer film forming apparatuses 31, three intermediate layer film forming apparatuses 32 and three resist film forming apparatuses 33 are respectively arranged side by side in the horizontal direction. The number and arrangement of the developing apparatuses 30, the lower layer film forming apparatuses 31, the intermediate layer film forming apparatuses 32 and the resist film forming apparatuses 33 may be arbitrarily selected.

In the developing apparatus 30, the lower layer film forming apparatus 31, the intermediate layer film forming apparatus 32 and the resist film forming apparatus 33, for example, spin coating is performed to apply a predetermined processing liquid on the wafer W. In the spin coating, for example, the processing liquid is discharged onto the wafer W from a coating nozzle, and the wafer W is rotated to diffuse the processing liquid onto the surface of the wafer W. In addition, a fluid supply apparatus 34 as a fluid supply part, which will be described later, is provided in the vicinity of the intermediate layer film forming apparatus 32.

For example, as shown in FIG. 3, in the second block G2, heat treatment apparatuses 40 for performing a heat treatment such as heating and cooling of the wafer W are provided side by side in the vertical direction and the horizontal direction. Each of these heat treatment apparatuses 40 has a configuration in which a predetermined heat treatment is performed on the wafer W and then a cooling treatment is immediately performed. As such a heat treatment apparatus, it may be possible to adopt, for example, a known heat treatment apparatus in which a heat treatment part having a hot plate for heat treatment inside a chamber and a cooling part having a cooling plate serving as a transfer member for transferring the wafers W to and from the hot plate are juxtaposed. The number and arrangement of the heat treatment apparatuses 40 may also be arbitrarily selected. The heat treatment apparatuses 40 include one for heating the lower layer film, one for heating the intermediate layer film, and one for PAB treatment.

The heat treatment apparatus 40 for heating the lower layer film performs a lower layer film heat treatment in which the wafer W having the lower layer film formed by the lower layer film forming apparatus 31 is heated to cure the lower layer film. The heat treatment apparatus 40 for heating the intermediate film performs an intermediate film heat treatment in which the wafer W having the intermediate film formed by the intermediate layer film forming apparatus 32 is heated to cure the intermediate film. The heat treatment apparatus 40 for PAB treatment performs a PAB treatment in which the wafer W having the resist film formed by the resist film forming apparatus 33 is heated before exposure to cure the resist film.

A plurality of delivery devices 50 is provided in the third block G3, and inspection devices 51 and 52 are provided above the plurality of delivery devices 50.

As shown in FIG. 1, a wafer transfer region D is formed in a region surrounded by the first block G1 to the fourth block G4. For example, a wafer transfer device 70 is arranged in the wafer transfer area D.

The wafer transfer device 70 includes, for example, a transfer arm 70a that can move in the Y direction, the front-rear direction, the θ direction, and the vertical direction. The wafer transfer device 70 can move inside the wafer transfer area D to transfer the wafer W to the predetermined apparatuses in the surrounding first block G1, second block G2, third block G3, and fourth block G4. For example, as shown in FIG. 3, a plurality of wafer transfer devices 70 is arranged one above another and can transfer the wafer W to the predetermined apparatuses having the same height in the respective blocks G1 to G4.

Further, in the wafer transfer region D, there is provided a shuttle transfer device 71 that linearly transfers the wafer W between the third block G3 and the fourth block G4.

For example, the shuttle transfer device 71 is linearly movable in the Y direction in FIG. 3. The shuttle transfer device 71 can move in the Y direction while supporting the wafer W and can transfer the wafer W between the delivery device 50 of the third block G3 and the delivery device 60 of the fourth block G4 having the same height.

As shown in FIG. 1, a wafer transfer device 72 is provided on the X-direction positive side of the third block G3. The wafer transfer device 72 includes, for example, a transfer arm 72a that can move in the front-rear direction, the θ direction, and the vertical direction. The wafer transfer device 72 can move up and down while supporting the wafer W and can transfer the wafer W to each delivery device 50 inside the third block G3.

The interface station 5 is provided with a wafer transfer device 73 and a delivery device 74. The wafer transfer device 73 includes, for example, a transfer arm 73a that can move in the Y direction, the θ direction, and the vertical direction. The wafer transfer device 73 can, for example, support the wafer W on the transfer arm 73a and can transfer the wafer W between each delivery device 60, the delivery device 74, and the exposure device 4 inside the fourth block G4.

Figure 4:
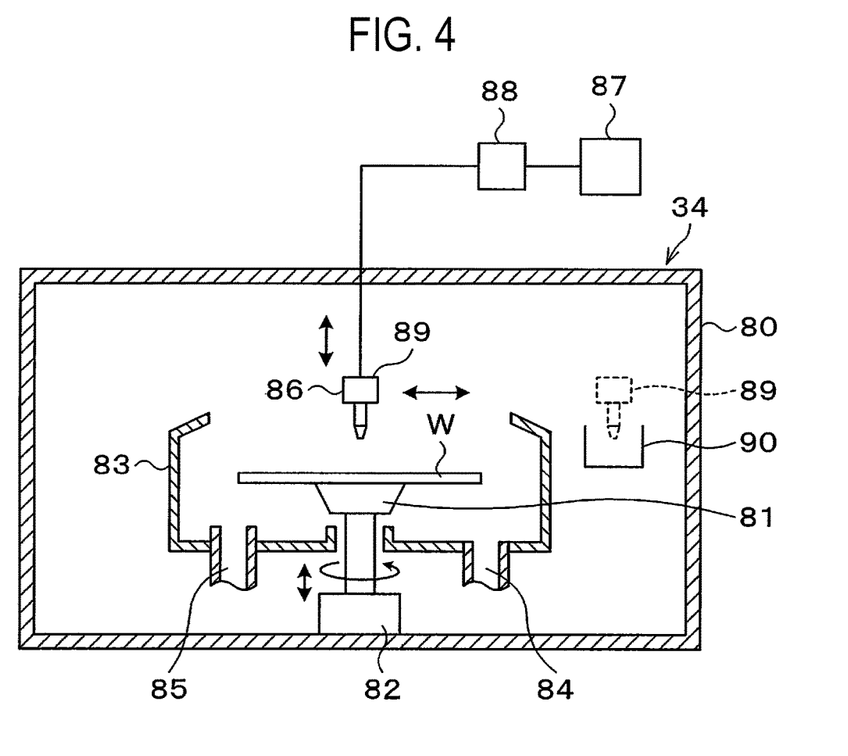
FIG. 4 is a side sectional view schematically showing an outline of a configuration of a fluid supply device placed on the substrate processing system shown in FIG. 1.

The fluid supply apparatus 34 has the configuration shown in FIG. 4. The fluid supply apparatus 34 has a general configuration as an apparatus for performing ordinary spin coating. That is, a spin chuck 81 for holding and rotating the wafer W is provided at the central portion of the interior of the processing container 80. The spin chuck 81 has a horizontal upper surface. For example, a suction port (not shown) for sucking the wafer W is provided in the upper surface. By performing suction through this suction port, the wafer W can be sucked and held on the spin chuck 81.

Below the spin chuck 81, for example, a chuck drive part 82 provided with a motor or the like is provided. The spin chuck 81 can be rotated at a predetermined speed by the chuck drive part 82. The chuck drive part 82 is provided with a lift drive source such as a cylinder or the like, and the spin chuck 81 can be raised and lowered.

Around the spin chuck 81, there is provided a cup 83 for receiving and collecting the liquid scattering or falling from the wafer W. An exhaust pipe 84 for discharging the collected liquid and an exhaust pipe 85 for exhausting an internal atmosphere of the cup 83 are connected to the lower surface of the cup 83.

A fluid that suppresses variations in film thickness over time until the measurement of the film thickness is supplied from a fluid supply nozzle 86 to the wafer W held on the spin chuck 81. In the present embodiment, DIW is supplied as the fluid. The DIW is stored in a fluid source 87 and is supplied to the fluid supply nozzle 86 via a flow rate adjustment device 88. The fluid supply nozzle 86 is supported by an arm 89 capable of moving in the direction indicated by a reciprocating arrow in FIG. 4 and can enter the cup 83 from a standby portion 90, retract, and move up and down. Thus, the DIW can be supplied to a desired position on the wafer W held by the spin chuck 81.

Further, the substrate processing system 1 is provided with a film thickness measurement device K. The film thickness measurement device K has a configuration in which the surface of the wafer W is irradiated with, for example, a laser beam inside a measurement container to measure the film thickness. A known measurement device may be used as the film thickness measurement device K.

As shown in FIG. 1, the substrate processing system 1 described above is provided with a controller 100. The controller 100 is, for example, a computer equipped with a CPU, a memory, and the like, and includes a program storage part (not shown). The program storage part stores a program for controlling various processes related to the wafer W in the substrate processing system 1, for example, various processes including the substrate processing process according to the present disclosure. The program may be recorded on a computer-readable storage medium H and may be installed on the controller 100 from the storage medium H. In addition, the storage medium H may be a transitory or non-transitory storage medium.

The substrate processing system 1 as the substrate processing apparatus according to the embodiment is configured as described above. Next, a substrate processing method using the substrate processing system 1 will be described with reference to the flowchart of FIG. 5. First, a SiARC film is applied to the wafer W by the intermediate layer film forming apparatus 32 (step S1). Then, the wafer W is transferred to the heat treatment apparatus 40 where the wafer is baked (heat-treated) to cure the SiARC film (step S3). Then, after being cooled to a predetermined temperature, for example, 23 degrees C., the wafer W is transferred to the fluid supply apparatus 34.

Figure 5:
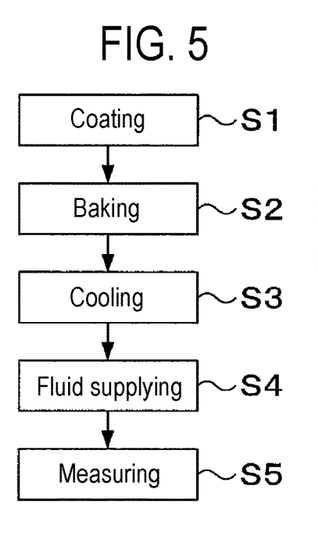
FIG. 5 is a flowchart showing a processing process of a substrate processing method according to an embodiment.

In the fluid supply apparatus 34, DIW as water is supplied to the surface of the cured SiARC film while rotating the wafer W held on the spin chuck 81. The DIW is uniformly supplied to the entire surface of the wafer W. As a result, the SiARC film is subjected to a substrate processing process that suppresses film thickness variations due to the over-time change.

According to the investigation conducted by the present inventors, a film is formed by a silanol dehydration condensation reaction as a characteristic of SiARC. During the heat treatment, a film having a small amount of water is formed in combination with the exhaust in the container. Then, along with the passage of time, the film absorbs the moisture in the air and swells to increase the film thickness. As a result, the optical characteristics also change and the film thickness varies. Therefore, the measured film thickness varies depending on the length of time from baking to film thickness measurement. This is indicated by the broken line in FIG. 6. That is, the film thickness is different at 20 minutes and 30 minutes after the baking process.

Figure 6:
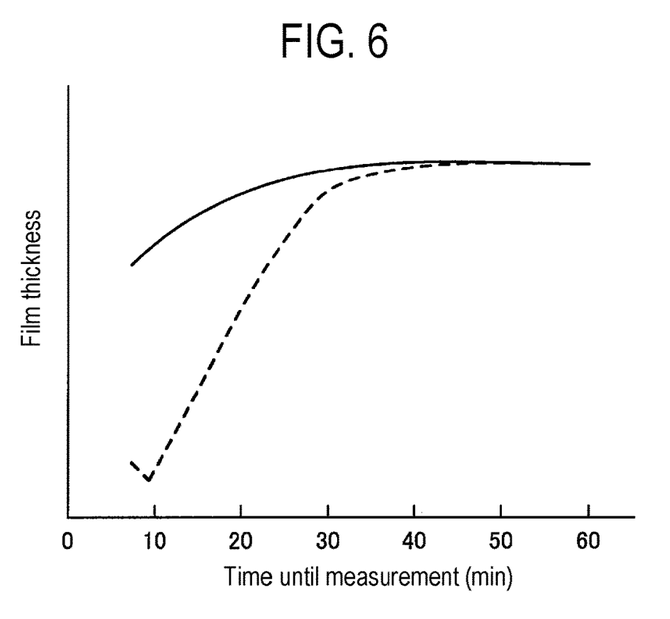
FIG. 6 is a graph showing a relationship between a change in time until film thickness measurement and a film thickness when DIW is supplied and when DIW is not supplied.

On the other hand, when the SiARC film is applied and the DIW is supplied after baking, as shown by the solid line in FIG. 6, the film thickness becomes almost constant after about 15 minutes from the supply of the DIW and hardly changes thereafter. Therefore, even if the time until the film thickness measurement varies, it is possible to suppress fluctuations and variations in the film thickness caused by the time variation.

After performing the fluid supply process in step S4 in this way, the wafer W is transferred to the film thickness measurement device K provided in the substrate processing system 1 to measure the film thickness (step S5).

Figure 7:
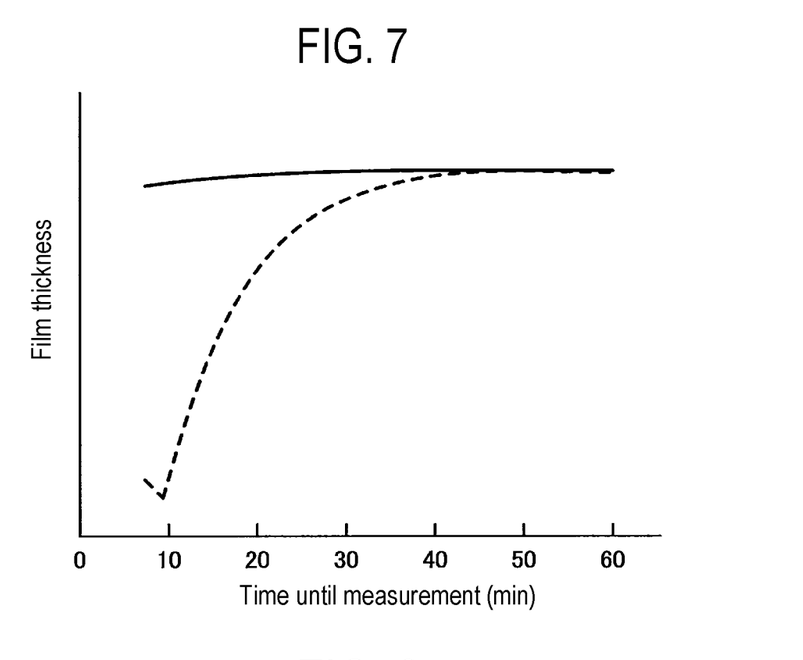
FIG. 7 is a graph showing a relationship between the change in time until the film thickness measurement and the film thickness when a thinner is supplied and when a thinner is not supplied.

In the example shown in FIG. 6, the coating film is the SiARC film. As for a KrF resist film, just like the SiARC film, it was confirmed that, as shown by the broken line in FIG. 7, the film thickness varies with the passage of time until the film thickness measurement after heat treatment and curing, and the film thickness varies due to the passage of time until the film thickness measurement.

In order to deal with this, an apparatus similar to the fluid supply apparatus 34 shown in FIG. 4 may be used to supply DIW, or instead of DIW, a thinner to the baked wafer W. The over-time change of the film thickness when the thinner is supplied as a fluid is indicated by the solid line in FIG. 7. The film thickness becomes constant almost immediately after the supply of the thinner and hardly changes thereafter. Therefore, even in such a case, even if the time until the film thickness measurement varies, it is possible to suppress fluctuations and variations in the film thickness caused by the time variation. The thinner as a fluid in such a case is, for example, a fluid supplied to the wafer W in the resist film forming process which is the next processing process. For example, the thinner is supplied to the wafer W in a so-called pre-wetting process before applying the resist liquid.

In the above-described embodiment, the entire substrate processing system 1 is regarded as the substrate processing apparatus of the present disclosure. The heat treatment part is embodied as the heat treatment apparatus 40 and the fluid supply part is embodied as the fluid supply apparatus 34. However, the present disclosure is not limited thereto. The substrate processing method shown in FIG. 8 may be carried out. In this example, after the coating film is applied (step S11), the heat treatment and the fluid supply process are performed in parallel (step S12).

Figure 9:
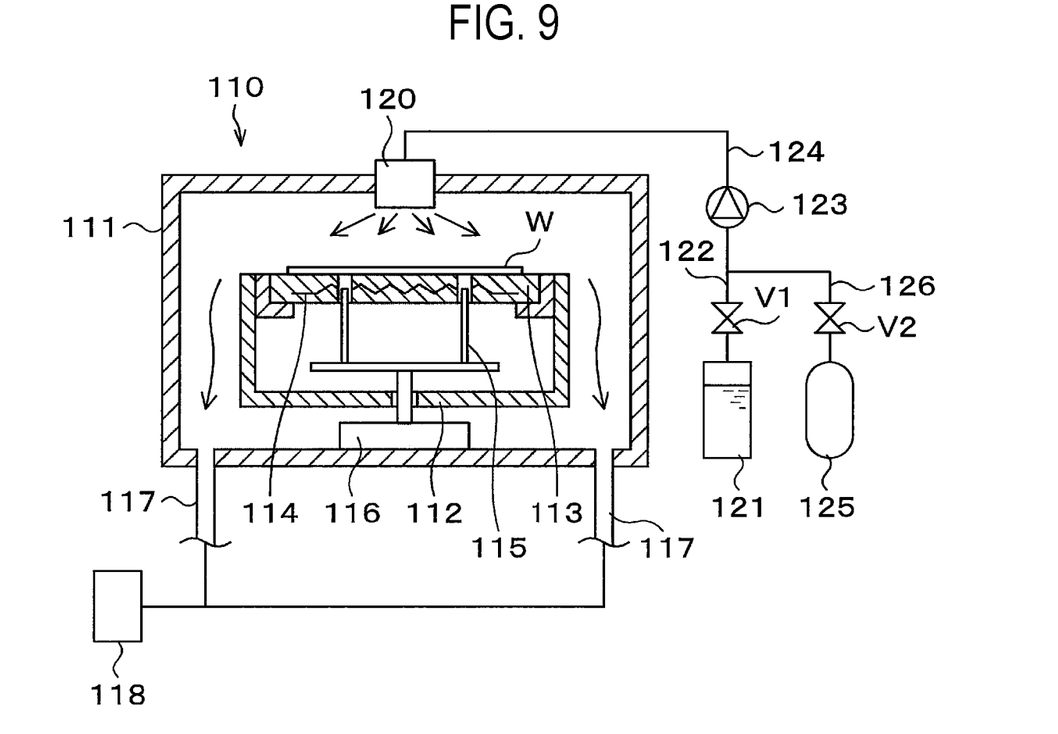
FIG. 9 is a side sectional view schematically showing an outline of a configuration of a substrate processing apparatus for carrying out the substrate processing method shown in FIG. 8.

As the substrate processing apparatus that performs the heat treatment and the fluid supply process in parallel in this way, for example, a substrate processing apparatus 110 shown in FIG. 9 may be exemplified.

The substrate processing apparatus 110 includes a hermetically sealable processing container 111 provided with a base 112. A stage 113 is provided on an upper surface of the base 112. A heater 114 for heating is provided inside the stage 113. The stage 113 constitutes a heat treatment part. The delivery of the wafer W to the stage 113 is performed via lift pins 115 which can be moved up and down by a drive mechanism 116. An exhaust pipe 117 is provided at the bottom of the processing container 111 below the periphery of the stage 113. The exhaust pipe 117 leads to an exhaust mechanism 118. As a result, the internal atmosphere of the processing container 111 is exhausted.

A gas supply part 120 is provided on a ceiling portion in the processing container 111. Steam of pure water can be supplied from a fluid source 121 storing water, for example, pure water to the gas supply part 120 through a supply path 122 and an air pump 123. The fluid source 121 may be provided with a heater that promotes evaporation of the pure water.

A valve V1 is provided in the supply path 122. Further, a clean gas, for example, a clean air or an inert gas may be supplied from a gas source 125 to the supply path 122 through a supply path 126. A valve V2 is provided in the supply path 126. Therefore, the humidity in the gas supplied to the gas supply part 120 can be appropriately adjusted by adjusting opening degrees of the valves V1 and V2.

The gas supply part 120 having such a configuration constitutes the fluid supply part of the present disclosure. Further, the configuration of the gas supply part 120 itself may be any configuration as long as it can uniformly supply a clean gas containing a predetermined humidity to the wafer W on the stage 113. For example, the configuration of the gas supply part 120 may be a baffle plate having a large number of discharge holes. For example, a high-humidity clean air having a relative humidity of 40 to 80% can be supplied from the gas supply part 120. For example, a clean air having a relative humidity of 60% is supplied to the wafer W on the stage 113.

Figure 8:
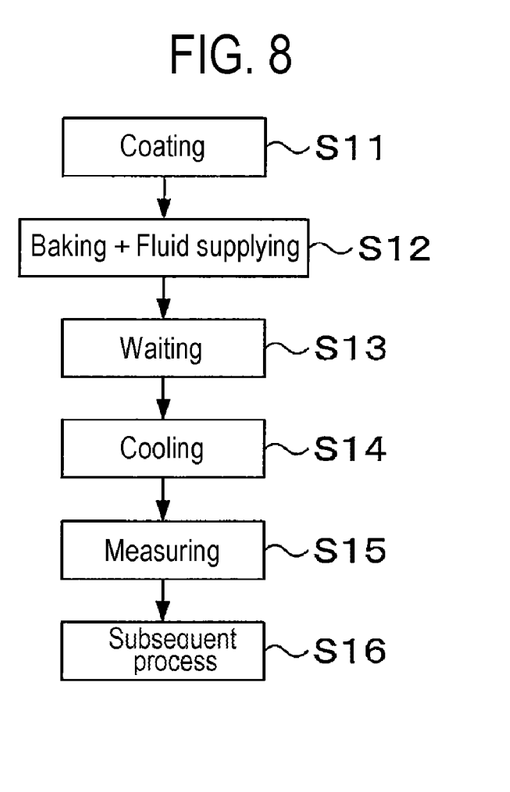
FIG. 8 is a flowchart showing a processing process of a substrate processing method according to another embodiment.

According to the substrate processing apparatus 110 having the above configuration, the heat treatment and the fluid supply process shown in step S12 of FIG. 8 can be performed in parallel. By supplying an air having a relative humidity of 60% to the baked wafer W, it is possible to suppress variations in the thickness of the SiARC film or the KrF resist film on the wafer W regardless of the length of time until the film thickness measurement.

After performing the baking process and the fluid supply process shown in step S12 of FIG. 8 in parallel, the wafer W is transferred to another processing container and is allowed to wait as necessary (step S13). Then, the wafer W is cooled (Step S14). Thereafter, the wafer W is transferred to the film thickness measurement device K provided in the substrate processing station 1 to measure the film thickness (step S15).

After the measurement, the wafer W is subjected to a subsequent processing process, for example, a resist film forming process when the coating film is a SiARC film, or an exposure process when the coating film is a KrF resist film (step S16).

In the substrate processing method shown in FIG. 8, the baking process and the fluid supply process are performed in parallel. Alternatively, as shown in FIG. 10, after the coating process (step S21), the baking process may be performed as usual (step S22), and the fluid supply process may be performed during a subsequent cooling process (step S23).

Figure 11:
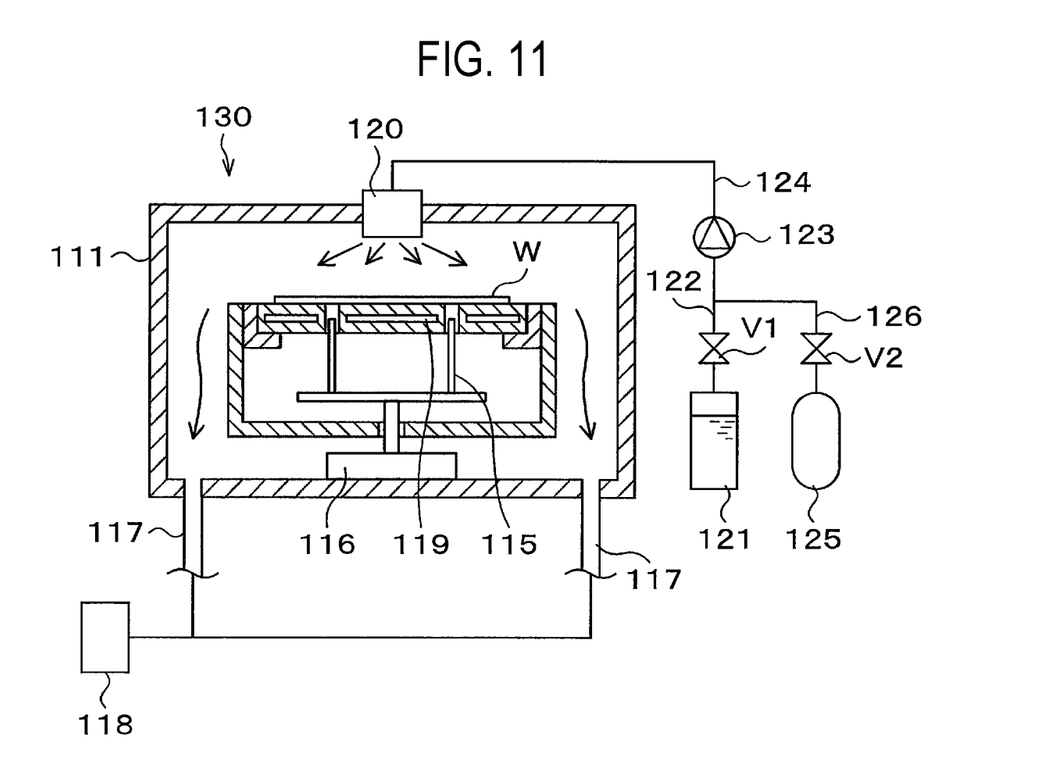
FIG. 11 is a side sectional view schematically showing an outline of a configuration of a substrate processing apparatus for carrying out the substrate processing method shown in FIG. 10.

As the apparatus for performing the cooling process and the fluid supply process in parallel after the baking process as described above, for example, a cooling apparatus 130 shown in FIG. 11 may be exemplified. The cooling apparatus 130 is provided with a cooling member 119 in place of the heater 114 arranged inside the stage 113 of the substrate processing apparatus 110 shown in FIG. 9. As the cooling member 119, it may be possible to adopt a known one such as a refrigerant flow path, a Pelier element or the like.

According to the cooling apparatus 130 having such a configuration, it is possible to supply the wafer W with a high-humidity clean air having a relative humidity of, for example, 40 to 80%, while cooling the baked wafer W on the stage 113. Therefore, it is possible to prevent the film thickness of the SiARC film or the KrF resist film formed as the coating film from fluctuating or varying depending on the time required for film thickness measurement.

Figure 10:
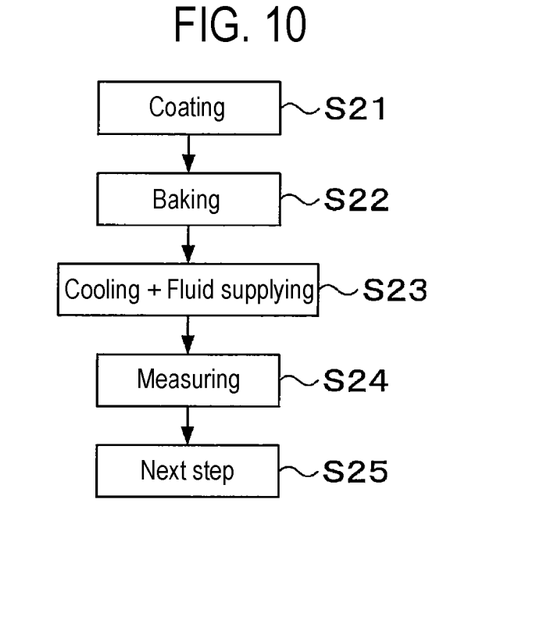
FIG. 10 is a flowchart showing a processing process of a substrate processing method according to still another embodiment.

Thereafter, as shown in FIG. 10, the wafer W is transferred to the film thickness measurement device K provided in the substrate processing system 1 to measure the film thickness (step S24). After the measurement, the wafer W is subjected to a subsequent processing process, for example, a resist film forming process when the coating film is a SiARC film, or an exposure process when the coating film is a KrF resist film (step S25).

Since the cooling apparatus 130 itself does not have a function of heat-treating the wafer W, the baking process in step S22 is required to be performed in another heat treatment apparatus, for example, the heat treatment apparatus 40 of the substrate processing system 1 or a heat treatment apparatus placed in another substrate treatment system. In such a case, the substrate processing apparatus of the present disclosure is configured as the substrate processing system 1.

In the above-described example, the film thickness of the wafer W is measured by the film thickness measurement device K provided in the substrate processing system 1. However, the film thickness of the wafer W may be measured in the substrate processing system 1. In such a case, the film thickness measurement device may be configured as a dedicated device, or a film thickness measurement mechanism may be installed above a loading/unloading port of an appropriate processing apparatus.

As described above, the substrate processing method according to the present disclosure may be regarded as a technique in which, on the substrate subjected to the coating film formation, with respect to the coating film cured after the baking process, the fluctuations in film thickness over time and variations in film thickness due to the length of time until film thickness measurement are suppressed by performing a process of positively and quickly increasing the film thickness in advance after the baking process. In such a case, the film thickness may be increased in advance by the technique according to the present disclosure, for example, to the film thickness immediately before the film thickness measurement.

According to the present disclosure in some embodiments, it is possible to suppress variations in film thickness measurement results for a substrate.

The embodiments disclosed herein should be considered to be exemplary and not limitative in all respects. The above embodiments may be omitted, replaced, or modified in various forms without departing from the scope of the appended claims and their gist.

What is claimed is:

1. A substrate processing apparatus comprising:
a film forming part configured to coat a substrate with a coating film;
a heat treatment part configured to heat-treat the substrate;
a fluid supply part configured to supply a fluid;
a measurement device configured to measure a film thickness of the coating film; and
a controller programmed to execute the following processing steps:
coating the substrate with the coating film by the film forming part;
heat-treating, by the heat treatment part, the substrate coated with the coating film to cure the coating film;
measuring a film thickness of the coating film by the measurement device; and
during or after the heat-treating the coated substrate and before the measuring the film thickness, supplying the fluid to the coated substrate by the fluid supply part so that the film thickness of the coating film, increased due to the heat treatment and passage of time, is then suppressed from varying over time.

2. The substrate processing apparatus of claim 1, wherein the fluid supply part is configured to supply water to the coated substrate inside a processing container separate from the heat treatment part after the heat treatment is performed in the heat treatment part.

3. The substrate processing apparatus of claim 1, wherein the fluid supply part is configured to supply a high-humidity atmosphere inside a processing container separate from the heat treatment part after the heat treatment is performed in the heat treatment part.

4. The substrate processing apparatus of claim 1, wherein the fluid supply part is configured to supply, with respect to the coated substrate, a liquid to be supplied in a subsequent processing process to the coated substrate.

5. The substrate processing apparatus of claim 1, wherein the fluid supply part is configured to supply a high-humidity atmosphere in the heat treatment part.

6. The substrate processing apparatus of claim 1, wherein the coating film is a SiARC film.

7. The substrate processing apparatus of claim 1, wherein the coating film is a KrF resist film.

8. The substrate processing apparatus of claim 1, wherein the coating film is a SiARC film and the fluid supply part is configured to supply water to the coated substrate.

9. The substrate processing apparatus of claim 1, wherein the coating film is a KrF resist film and the fluid supply part is configured to supply a thinner to the coated substrate.

10. A non-transitory computer-readable storage medium storing a program that controls a controller to cause a substrate processing apparatus to perform a substrate processing method,
wherein the substrate processing apparatus comprises:
a film forming part configured to coat a substrate with a coating film;
a heat treatment part configured to heat-treat the substrate; and
a fluid supply part configured to supply a fluid; and a measurement device configured to measure a film thickness of the coating film, and wherein the substrate processing method comprises the following processing steps:

coating the substrate with the coating film by the film forming part;

heat-treating, by the heat treatment part, the substrate coated with the coating film;

measuring a film thickness of the coating film by the measurement device; and during or after the heat-treating the coated substrate and before the measuring the film thickness, supplying the fluid to the coated substrate by the fluid supply part so that the film thickness of the coating film, increased due to the heat treatment and passage of time, is then suppressed from varying over time.

* * * * *